US007354328B2

(12) United States Patent
Lee

(10) Patent No.: US 7,354,328 B2
(45) Date of Patent: Apr. 8, 2008

(54) ORGANIC ELECTROLUMINESCENT DEVICE AND FABRICATING METHOD THEREOF

(75) Inventor: Jae-Yoon Lee, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 284 days.

(21) Appl. No.: 10/876,621

(22) Filed: Jun. 28, 2004

(65) Prior Publication Data
US 2005/0142974 A1  Jun. 30, 2005

(30) Foreign Application Priority Data
Dec. 30, 2003  (KR) .................... 10-2003-0100676

(51) Int. Cl.
*H01J 9/24* (2006.01)
*H05B 33/26* (2006.01)

(52) U.S. Cl. .......................... 445/24; 445/25; 313/306
(58) Field of Classification Search ............... 445/24
See application file for complete search history.

(56) References Cited

U.S. PATENT DOCUMENTS

| 5,276,380 | A | 1/1994 | Tang |
| 5,294,869 | A | 3/1994 | Tang et al. |
| 5,294,870 | A | 3/1994 | Tang et al. |
| 5,701,055 | A | 12/1997 | Nagayama et al. |
| 5,742,129 | A | 4/1998 | Nagayama et al. |
| 5,952,037 | A | 9/1999 | Nagayama et al. |
| 6,046,547 | A | 4/2000 | Nishio et al. |
| 6,175,345 | B1 | 1/2001 | Kuribayashi et al. |
| 6,373,455 | B1 | 4/2002 | Kuribayashi et al. |
| 6,548,961 | B2 | 4/2003 | Barth et al. |
| 6,552,364 | B2 * | 4/2003 | Beck et al. ................... 257/79 |
| 6,633,134 | B1 | 10/2003 | Kondo et al. |
| 6,689,632 | B2 * | 2/2004 | Kim et al. ..................... 438/29 |
| 6,719,916 | B2 * | 4/2004 | Dubowski et al. .......... 438/690 |
| 2003/0127657 | A1 * | 7/2003 | Park ............................ 257/79 |
| 2003/0157737 | A1 * | 8/2003 | Bright et al. ................. 438/22 |
| 2003/0201712 | A1 * | 10/2003 | Park et al. ................... 313/504 |
| 2004/0017151 | A1 * | 1/2004 | Kim et al. ................... 313/504 |
| 2004/0115474 | A1 * | 6/2004 | Albrecht et al. ............ 313/504 |
| 2004/0235224 | A1 * | 11/2004 | Lin et al. .................... 438/149 |

FOREIGN PATENT DOCUMENTS

| KR | 10-2002-71986 A | 9/2002 |
| KR | 10-2002-0015138 | 9/2003 |
| KR | 10-2002-0022812 | 11/2003 |
| KR | 10-2002-0022813 | 11/2003 |
| KR | 10-2003-86167 | 11/2003 |
| KR | 10-2003-92314 A | 12/2003 |
| WO | WO 02/078101 A1 | 10/2002 |

\* cited by examiner

*Primary Examiner*—Sikha Roy
*Assistant Examiner*—Natalie K. Walford
(74) *Attorney, Agent, or Firm*—McKenna, Long & Aldridge LLP

(57) ABSTRACT

A method of fabricating a substrate for an organic electroluminescent device includes forming a first electrode on a substrate having a pixel region; forming an insulating layer on the first electrode at a boundary of the pixel region; forming an electroluminescent layer on the first electrode in the pixel region by printing a solution type electroluminescent material; forming a second electrode material layer on an entire surface of the substrate having the electroluminescent layer and the insulating layer; and oxidizing or ablating by laser the second electrode material layer at the boundary of the pixel region to form a second electrode in the pixel region and a metal oxide layer at the boundary of the pixel region.

18 Claims, 18 Drawing Sheets

ORGANIC ELECTROLUMINESCENT DEVICE AND FABRICATING METHOD THEREOF

The present invention claims the benefit of the Korean Patent Application No. 2003-100676 filed in Korea on Dec. 30, 2003, which is hereby incorporated by reference for all purposes as if fully set forth herein.

BACKGROUND OF THE INVENTION

1. Field of the Invention

The present invention relates to an organic electroluminescent device (ELD), and more particularly to a dual plate type organic ELD and a method of fabrication thereof.

2. Discussion of the Related Art

In general, an organic ELD emits light by injecting electrons from a cathode and holes from an anode into a luminescence layer, combining the electrons with the holes, generating excitons, and transitioning the excitons from an excited state to a ground state. Compared to a liquid crystal display (LCD) device, an additional light source is not necessary for the organic ELD to emit light because the transition of the excitons between the two states causes light to be emitted. Accordingly, the size and weight of the organic ELD can be reduced. The organic ELD has other excellent characteristics such as low power consumption, superior brightness, and fast response time. Because of these characteristics, the organic ELD is regarded as a promising display for next-generation consumer electronic applications such as cellular phones, car navigation system (CNS), personal digital assistants (PDA), camcorders, and palmtop computers. Moreover, since fabricating the organic ELD is a simple process with few processing steps, it is much cheaper to produce an organic ELD than an LCD device.

Two different types of organic ELDs exist: passive matrix and active matrix. While both the passive matrix organic ELD and the active matrix organic ELD have a simple structure and are formed by a simple fabricating process, the passive matrix organic ELD requires a relatively high amount of power to operate. In addition, the display size of a passive matrix organic ELD is limited by its structure. Furthermore, as the number of conductive lines increases, the aperture ratio of a passive matrix organic ELD decreases. In contrast, active matrix organic ELDs are highly efficient and can produce a high-quality image for a large display with a relatively low power.

FIG. 1 is an energy band diagram of an organic ELD. As shown in FIG. 1, an anode 1 and a cathode 7 are spaced apart from each other. A luminescence layer 4 is interposed between the anode 1 and the cathode 7. A hole transporting layer 3 is interposed between the anode 1 and the luminescence layer 4, and an electron transporting layer 5 is interposed between the luminescence layer 4 and the cathode 7 to improve luminescence efficiency. The hole injected from the anode 1 and the electron injected from the cathode 7 combine in the luminescence layer 4, and light corresponding to an energy between the hole and the electron is emitted from the excitons. The anode 1 may be made of a transparent conductive material having a high work function and, the cathode 7 may be made of a metallic material having a low work function and stable chemical property.

FIG. 2 is a schematic cross-sectional view of a bottom emission type organic ELD according to a related art. In FIG. 2, an array element 14 including a thin film transistor (TFT) "T" is formed on a first substrate 10. A first electrode 16, an organic electroluminescent (EL) layer 18, and a second electrode 20 are formed over the array element 14. The organic EL layer 18 may separately display red, green, and blue colors in each pixel region. Generally, the divided organic materials are used to emit light of each color for the organic EL layer in each pixel region. An organic ELD is encapsulated by attaching the first substrate 10 to a second substrate 28 with a sealant 26. The second substrate 28 includes a moisture absorbent material 22 to eliminate moisture and oxygen that may penetrate into a capsule of the organic EL layer 18. After etching a portion of the second substrate 28, the etched portion is filled with the moisture absorbent material 22 and the filled moisture absorbent material is fixed by a holding element 25.

FIG. 3 is an equivalent circuit diagram of the organic ELD according to the related art. In FIG. 3, a gate line "GL" crosses a data line "DL", and a switching element "$T_S$" at a crossing of the gate line "GL" and the data line "DL" is connected to the gate line "GL" and the data line "DL." A driving element "$T_D$" is electrically connected to the switching element "$T_S$" and an organic electroluminescent diode "$D_{EL}$." The switching element "$T_S$" includes a switching source electrode "S4", a switching gate electrode "S2" and a switching drain electrode "S6". Also, the driving element "$T_D$" includes a driving source electrode "D4", a driving gate electrode "D2" and a driving drain electrode "D6". A storage capacitor "$C_{ST}$" is formed between the driving gate electrode "D2" and the driving drain electrode "D6" of the driving element "$T_D$," and the organic electroluminescent diode "$D_{EL}$" is connected to a power line "PL."

When a scan signal of the gate line "GL" is applied to the switching gate electrode "S2" of the switching element "$T_S$," an image signal of the data line "DL" is applied to the driving gate electrode "D2" of the driving element "$T_D$" through the switching element "$T_S$." The current density of the driving element "$T_D$" is modulated by the image signal applied to the driving gate electrode "D2." As a result, the organic electroluminescent diode "$D_{EL}$" can display images with gray scale levels. Moreover, because the image signal stored in the storage capacitor "$C_{ST}$" is applied to the driving gate electrode "D2," the current density flowing into the organic electroluminescent diode "$D_{EL}$" is uniformly maintained until the next image signal is applied, even when the switching element "$T_S$" is turned off. The switching element "$T_S$" and the driving element "$T_D$" may be a polycrystalline silicon TFT or an amorphous silicon TFT. The process of fabricating an amorphous silicon TFT is simpler than the process for a polycrystalline silicon TFT.

Meanwhile, the organic ELD should have red, green and green organic EL layers in each pixel region to display full color. The organic EL layers are divided by separators having an inverted trapezoid shape to provide a stable coating process for the organic EL layer. In an organic ELD having such separators, the organic EL layers are formed by dropping or injecting a solution type organic EL material in the pixel regions surrounded by the separators.

FIGS. 4A to 4F are schematic cross-sectional views illustrating a fabricating process of an organic ELD including an inkjet-printing step according to the related art.

In FIG. 4A, a substrate 30 includes emission regions "C" and non-emission regions "D" adjacent to the emission regions "C." First electrodes 32 (an anode) are formed on the substrate 30 in the emission regions "C" by depositing a transparent conductive material. In addition, a buffer layer 34 is formed on the substrate 30 in the non-emission regions "D" and overlaps an edge portion of the first electrodes 32. The buffer layer 34 may be made of silicon nitride (SiNx) or silicon oxide ($SiO_2$). In addition, thin film transistors (TFTs)

"T" are formed between the substrate 30 and the first electrodes 32, and are connected to the first electrodes 32 in each of the pixel regions "P." Although not shown in FIG. 4A, the TFT "T" includes a switching TFT and a driving TFT, and the first electrode 34 are connected to a driving drain electrode of the driving TFT.

In FIGS. 4B and 4C, an organic material layer 40 is coated over an entire surface of the substrate 30 having the first electrodes 32 and the buffer layer. Then, a photo-resist layer 45 is coated on an entire surface of the organic material layer 40, and a mask 50 having light-transmitting portions "m1" and light-shielding portions "m2" is disposed over the substrate 30. The photo-resist layer 45 is patterned by a photolithography process, which includes exposure and development steps. Photo-resists are classified into a positive type and a negative type. When the photo-resist layer 45 is a positive type, then the light-transmitting portions "m1" exposed to light are removed during the development step. On the other hand, when the photo-resist layer 45 is a negative type, then light-shielding portions "m2" are removed during the development step. In FIGS. 4B and 4C, because the photo-resist layer 45 is a negative type photo-resist, the portions of the photo-resist layer 45 corresponding to the light-shielding portions "m2" are removed. Thus, the photo-resist layer 45 corresponding to the light-transmitting portions "m1" remains as photo-resist patterns 46, as shown in FIG. 4D.

In FIG. 4D, a plurality of separators 41 are formed by etching the organic material layer 40 (of FIG. 4C) using the photo-resist patterns 46 as a mask. During the etching step, the exposed organic material layer 40 (of FIG. 4C) between the photo-resist patterns 46 is removed by an etchant. The separators 41 prevent color mixing, because the separators 41 surround each pixel region "P." Although not shown in FIG. 4D, the photo-resist patterns 46 are stripped off after forming the separators 41.

In FIG. 4E, red, green and blue organic EL layers 42a, 42b and 42c are formed on the substrate 30 having the separators 41 by inkjet-printing red, green and blue organic EL materials. The red, green and blue organic EL layers 42a, 42b and 42c may be formed by dispensing each color organic EL material through an inkjet nozzle (not shown) in the pixel regions "P" surrounded by the separators 41. Because the separators 41 are located at boundaries of the pixel regions "P" and have a predetermined height, color mixing of the red, green and blue organic EL layers 42a, 42b and 42c can be prevented at the boundaries of the pixel regions "P."

In FIG. 4F, a second electrode 44 is formed over the substrate 30 having the red, green and blue organic EL layers 42a, 42b and 42c in the pixel regions "P." When the second electrode 44 functions as a cathode, the second electrode 44 may be a metallic material having a low work function and a good reflectivity.

However, in order to form the separators using an organic material, a photolithography process is required, which includes the steps of coating, exposure and development. Therefore, production cost increases. In addition, because the height of the separators formed of an organic material is relatively high, a metal layer that will be formed later on the organic electroluminescent layer may be undesirably cut during the deposition of the metal layer, leading to a manufacturing defect. Moreover, the organic material dispensed in the pixel regions by an inkjet method is not uniform. In particular, the thickness of the organic material near the separators are thicker than the thickness of the organic material in other areas, as illustrated in FIG. 4F. This is called a pinning phenomenon which is caused by the surface tension between the organic material and the separators.

SUMMARY OF THE INVENTION

Accordingly, the present invention is directed to an organic ELD and a method of fabrication thereof that substantially obviate one or more of the problems due to limitations and disadvantages of the related art.

An advantage of the present invention is to provide an organic ELD with a simplified manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a substrate for an organic electroluminescent device includes forming a first electrode on a substrate having a pixel region; forming an insulating layer on the first electrode at a boundary of the pixel region; forming an electroluminescent layer on the first electrode in the pixel region by printing a solution type electroluminescent material; forming a second electrode material layer on an entire surface of the substrate having the electroluminescent layer and the insulating layer; and oxidizing the second electrode material layer at the boundary of the pixel region to form a second electrode in the pixel region and a metal oxide layer at the boundary of the pixel region.

In another aspect, a method of fabricating a substrate for an organic electroluminescent device, includes forming a first electrode on a substrate having a pixel region; forming a insulating layer on the first electrode at a boundary of the pixel region; forming an electroluminescent layer on the first electrode in the pixel region by printing a solution type electroluminescent material; forming a second electrode material layer on an entire surface of the substrate having the electroluminescent layer and the insulating layer; and ablating the second electrode material layer at the boundary by a laser to form a second electrode in the pixel region.

In another aspect, a method of fabricating an organic electroluminescent device, includes forming an array element on a first substrate having a pixel region, the array element having a thin film transistor; forming a first electrode on a second substrate in the pixel region; forming an insulating layer on the first electrode at a boundary of the pixel region; forming an electroluminescent layer on the first electrode in the pixel region by printing a solution type electroluminescent material; forming a second electrode material layer on an entire surface of the second substrate having the electroluminescent layer and the insulating layer; forming a second electrode in the pixel region by separating the second electrode material layer; forming a connection electrode on one of the first and second substrate; and attaching the first substrate to the second substrate with a sealant, the first substrate electrically connected to the second substrate by the connection electrode.

In another aspect, an organic electroluminescent device includes a first electrode on a substrate having a plurality of pixel regions; an insulating layer on the first electrode at boundaries of the pixel regions; a plurality of electroluminescent layers on the first electrode in the pixel region; a plurality of second electrodes on the electroluminescent layers; and a metal oxide layer on the insulating layer, the second electrodes are electrically divided from each other by the metal oxide layer.

In another aspect, an organic electroluminescent device, includes a first electrode on a substrate having a plurality of pixel regions; an insulating layer on the first electrode at boundaries of the pixel regions, a top surface of the insulating layer has a hydrophobic property; a plurality of electroluminescent layers on the first electrode in the pixel regions, the electroluminescent layers has a hydrophilic property; and a plurality of second electrodes on the electroluminescent layers, the second electrodes are physically divided from each other.

In another aspect, an organic electroluminescent device, includes: a first electrode on a substrate having a pixel region; an insulating layer on the first electrode at a boundary of the pixel region; a separator on the insulating layer, the separator has an inverted trapezoid shape such that a width of the separator gradually increases from a first side to a second side of the separator, the first side is closer to the substrate than the second side; an electroluminescent layer on the first electrode in the pixel region; and a second electrode on the electroluminescent layer, the second electrode physically divides for an adjacent second electrode at the boundary.

In another aspect, an organic electroluminescent device, includes: first and second substrates facing and spaced apart from each other, the first and second substrates having a pixel region; an array element on an inner surface of the first substrate in the pixel region, the array element having a thin film transistor; a first electrode on the inner surface of the first substrate; an insulating layer on the first electrode at a boundary of the pixel region; an electroluminescent layer on the first electrode in the pixel region; a second electrode on the electroluminescent layer; a metal oxide layer on a top surface of the insulating layer, the second electrode electrically divides for an adjacent second electrode by the metal oxide layer; and a connection electrode electrically connecting to the first and the second substrates.

Yet, in another aspect, an organic electroluminescent device, includes: first and second substrates facing and spaced apart from each other, the first and second substrates having a pixel region; an array element on an inner surface of the first substrate in the pixel region, the array element having a thin film transistor; a first electrode on the inner surface of the first substrate; an insulating layer on the first electrode at a boundary of the pixel region, a top surface of the insulating layer has a hydrophobic property; an electroluminescent layer on the first electrode in the pixel region, the electroluminescent material has a hydrophile property; a second electrode on the electroluminescent layer, the second electrode physically divides for an adjacent second electrode at the boundary; and a connection electrode electrically connecting to the first and the second substrates.

Still, in another aspect, an organic electroluminescent device, includes: first and second substrates facing and spaced apart from each other, the first and second substrates having a pixel region; an array element on an inner surface of the first substrate in the pixel region, the array element having a thin film transistor; a first electrode on the inner surface of the first substrate; an insulating layer on the first electrode at a boundary of the pixel region; a separator on the insulating layer, the separator has an inverted trapezoid shape such that a width of the separator gradually increases from a first side to a second side of the separator, the first side is closer to the substrate than the second side; an electroluminescent layer on the first electrode in the pixel region; a second electrode on the electroluminescent layer, the second electrode physically divides for an adjacent second electrode at the boundary; and a connection electrode electrically connecting to the first and the second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings.

Figure 1:
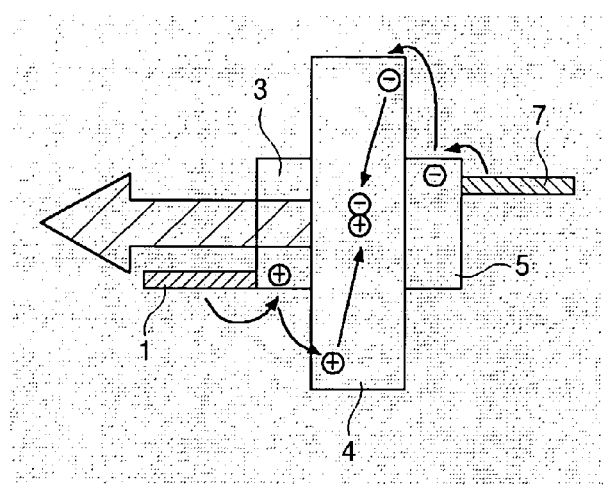
FIG. 1 is an energy band diagram of an organic ELD.
Figure 2:
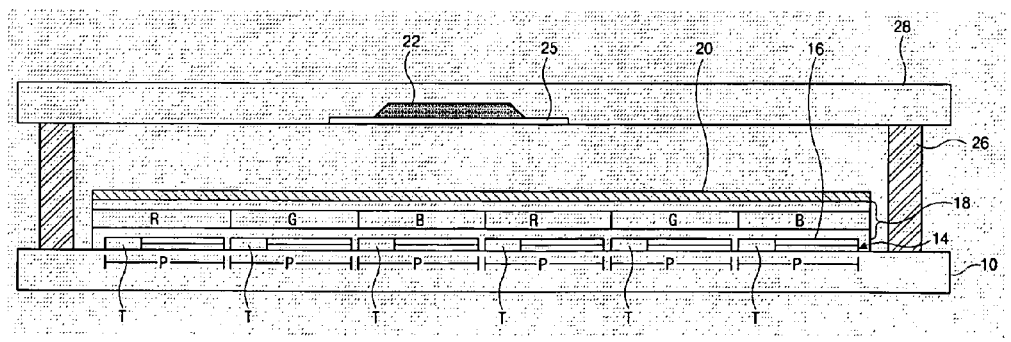
FIG. 2 is a schematic cross-sectional view of a bottom emission type organic ELD according to a related art.
Figure 3:
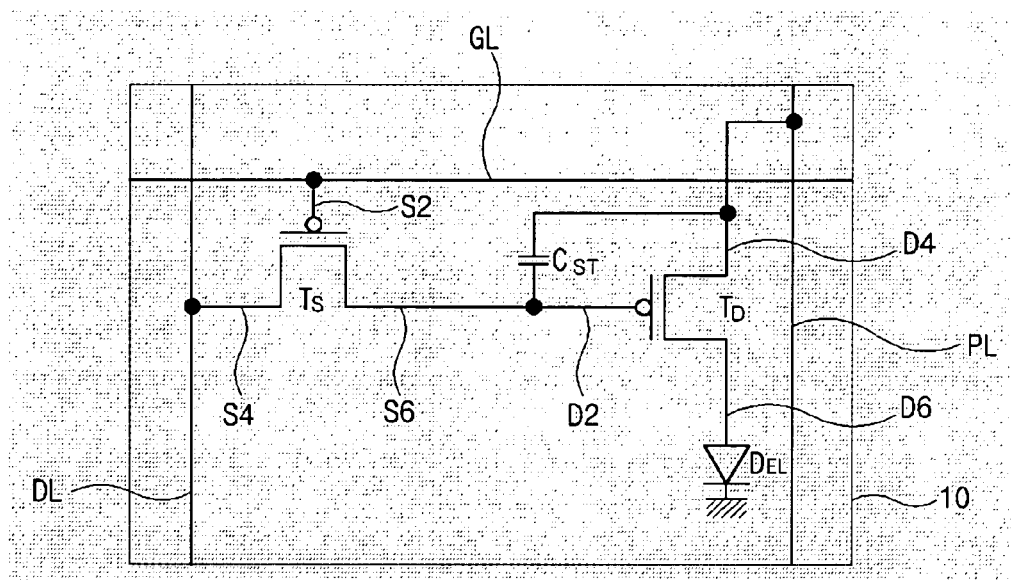
FIG. 3 is an equivalent circuit diagram of an organic ELD according to the related art.
Figure 4A:
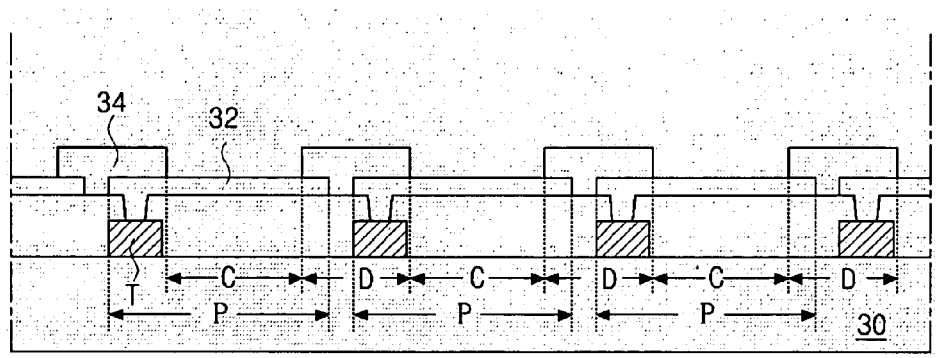
FIGS. 4A to 4F are schematic cross-sectional views illustrating a fabrication process of an organic ELD including an inkjet-printing step according to the related art.
Figure 4B:
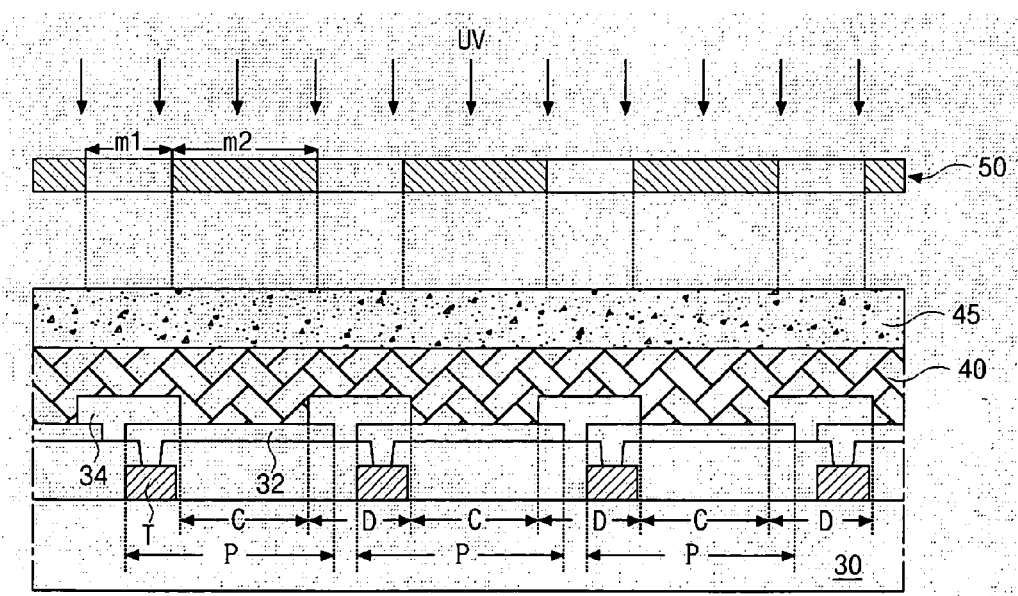
Figure 4C:
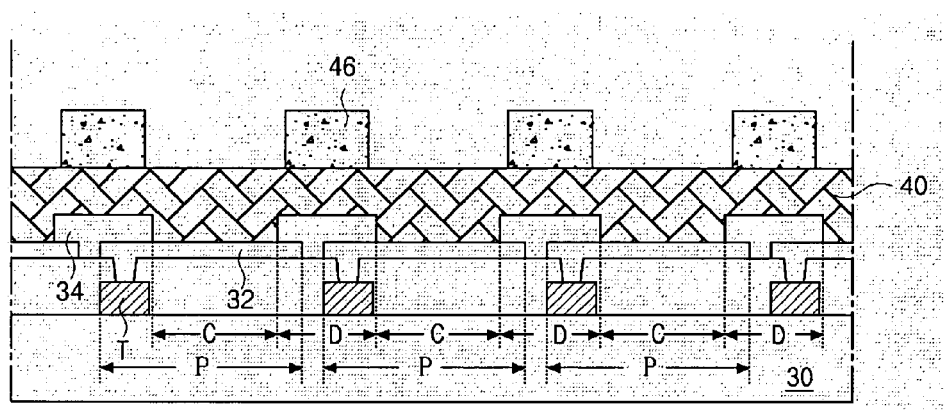
Figure 4D:
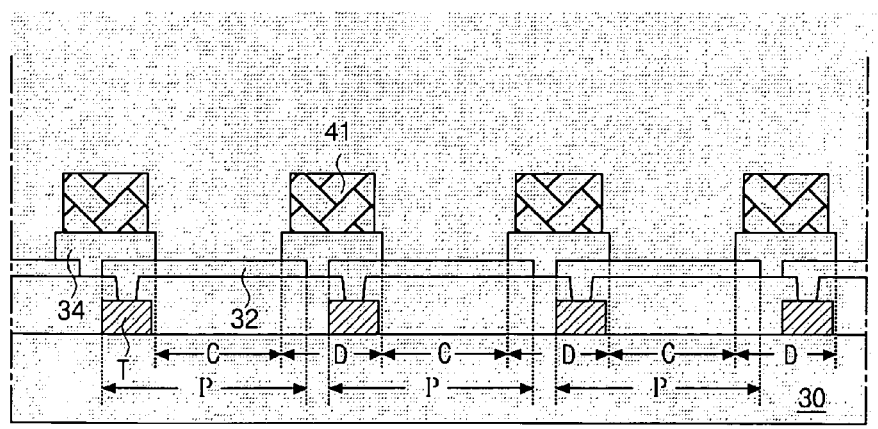
Figure 4E:
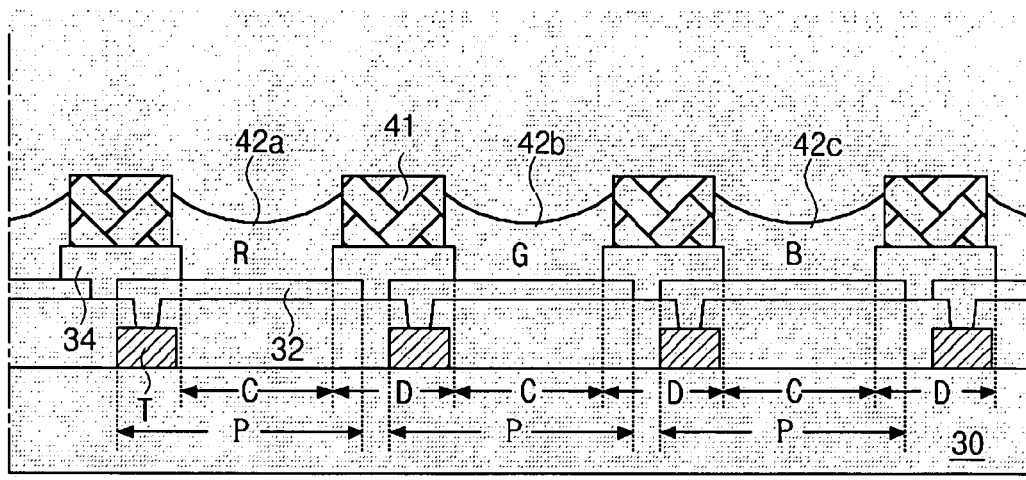
Figure 4F:
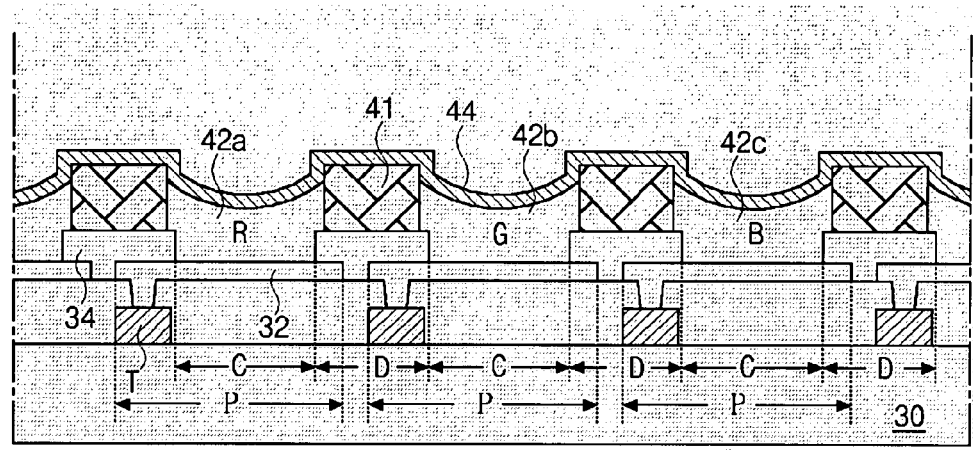
Figure 5:
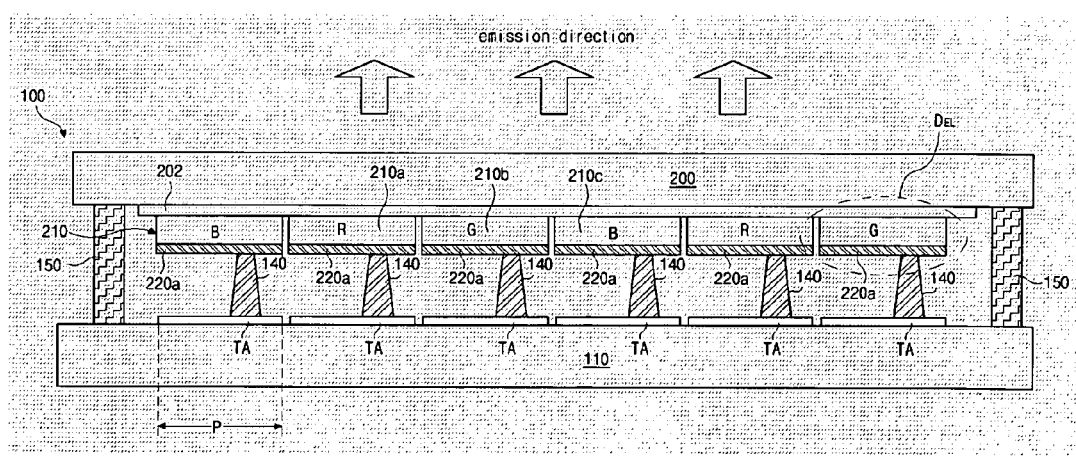
FIG. 5 is a schematic cross-sectional view illustrating a dual plate organic ELD according to an embodiment of present invention.

FIG. 5 is a schematic cross-sectional view illustrating a dual plate organic ELD according to an embodiment of present invention.

In FIG. 5, a dual plate organic ELD 100 includes first and second substrates 110 and 200 that face to each other and are spaced apart from each other. In addition, the first and second substrates 110 and 200 have a plurality of pixel regions "P." An array element "TA" includes a plurality of TFTs (not shown). Although not shown in FIG. 5, the array element "TA" may include gate lines, data lines crossing the gate lines, a switching TFT connected to the gate and data line, a driving TFT connected to the switching TFT, a power line connected to the driving TFT, and a storage capacitor. The switching TFT and the driving TFT constitute a TFT. The TFT may be an amorphous silicon TFT or a poly-silicon TFT. In addition, a plurality of connection electrodes 140 connected to the array elements "TA" are formed on the array elements "TA" in the pixel regions "P." The connection electrodes 140 are made of a conductive material. The connection electrodes 140 may be formed of multiple layers including an insulating pattern. The connection electrodes 140 may be connected to the array elements "TA" by an additional connection means.

Meanwhile, a first electrode 202 is formed on an inner surface of the second substrate 200, an organic EL layer 210 is formed on the first electrode 202, and the organic EL layer 210 includes red, green and blue organic EL layers 210a, 210b and 210c. Each of the red, green and blue organic EL layers 210a, 210b and 210c is located in each of the pixel regions "P." A plurality of second electrodes 220a are formed on the organic EL layer 210 in the pixel regions "P." In this embodiment, the first electrode 202 functions as an anode, and the second electrodes 220a function as a cathode. The first electrode 202 is made of a transparent conductive material such as tin oxide (ITO), indium zinc oxide (IZO), indium tin zinc oxide (ITZO), or the like. The second electrode 220a is made of an opaque conductive material such as titanium (Ti), molybdenum (Mo), calcium (Ca), barium (Ba), or the like.

Although not shown in FIG. 5, the organic EL layer 210 includes a first carrier transporting layer contacting the first electrode 202 and a second carrier transporting layer contacting the second electrodes 220a with an emitting layer therebetween. When the first electrode 202 functions as an anode and the second electrodes 220a function as a cathode, the first carrier transporting layer may include a hole injection layer and a hole transporting layer, and the second carrier transporting layer may include a hole injection layer and a hole transporting layer.

The first and second electrodes 202 and 220a and the organic EL layer 210 constitute organic electroluminescent diodes "$D_{EL}$." The second substrate 200 having the organic electroluminescent diodes "$D_{EL}$" and the first substrate 110 having the array elements "TA" are electrically connected through the connection electrodes 140. In particular, the connection electrode 140 connect the second electrode 220a and the driving TFT (not shown). Therefore, the connection electrode 140 may provide the second electrode 220a with a current supplied from the driving TFT.

Meanwhile, a seal pattern 150 is located at an edge of the first and second substrate 110 and 200, and the first and second substrates 110 and 200 are attached to each other with the seal pattern 150.

An organic EL device according to this embodiment of the present invention is a dual plate type wherein the array element layer "TA" and the organic EL diode "$D_{EL}$" are formed on their respective substrates and the connection electrode 140 connects the array element layer "TA" to the organic EL diode "$D_{EL}$." Various modifications and variations can be made in a structure of the TFT and a connecting method of the array layer and the organic EL diode "$D_{EL}$." Moreover, since the organic EL device according to the present invention is a top emission type, a thin film transistor can be easily designed, and a high resolution and a high aperture ratio can be obtained.

Although not shown in FIG. 5, the organic EL layers 210 may be separated each other by a separator or a hydrophobic insulating layer. Also, the second electrodes 220a may be physically separated each other by a laser ablation, or electrically separated each other by oxidation. In FIG. 5, since the dual plate type organic ELD is a top emission type, the overall design of the array elements including TFTs may be simplified, and the aperture ratio can be increased, thereby increasing the operational lifetime of the organic ELD.

FIGS. 6A to 6E are schematic cross-sectional views illustrating a fabricating process according to a first embodiment of present invention.

Figure 6A:
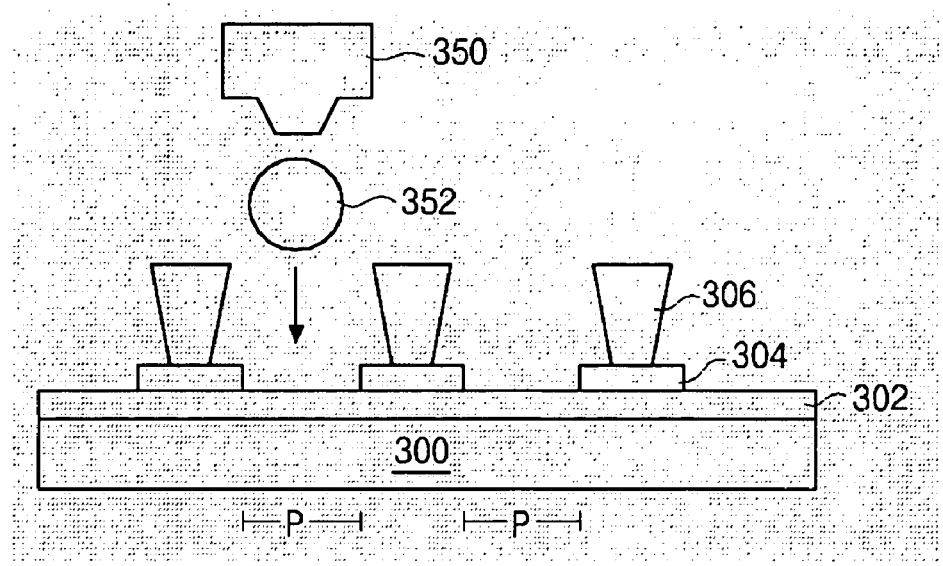
FIGS. 6A to 6E are schematic cross-sectional views illustrating a fabricating process according to a first embodiment of present invention.

In FIG. 6A, pixel regions "P" is defined in a substrate 300. A first electrode 302 is formed on the substrate 300 including the pixel regions "P." The first electrode 302 is made of a transparent conductive material such as tin oxide (ITO), indium zinc oxide (IZO), indium tin zinc oxide (ITZO), or the like. Then, an insulating layer 304 is formed on the first electrode 302 at boundaries of the pixel regions "P" to prevent shorting between the first electrode 302 and a second electrode that will be formed later. Although not shown in FIG. 6A, the insulating layer 304 may be formed as one body in a plan view. In addition, the insulating layer 304 may be formed by depositing and patterning silicon nitride (SiNx) or silicon oxide (SiO2), or by coating and patterning polyimide. For example, a process for patterning a polyimide layer may be a photolithography process using a photo-resist pattern.

Then, an organic photosensitive material is coated on an entire surface of the insulating layer 304 and is patterned into separators 306 which have an inverted taper shape, as illustrated in FIG. 6A. The inverted shape of the separators 306 may be formed by controlling an amount of an exposing light or selecting types of organic photosensitive materials. Then, an ink 352 including an organic electroluminescent material is dispensed on the substrate 300 including the separators 306 through an inkjet head 350 by an inkjet printing method, as shown in FIG. 6A.

Figure 6B:
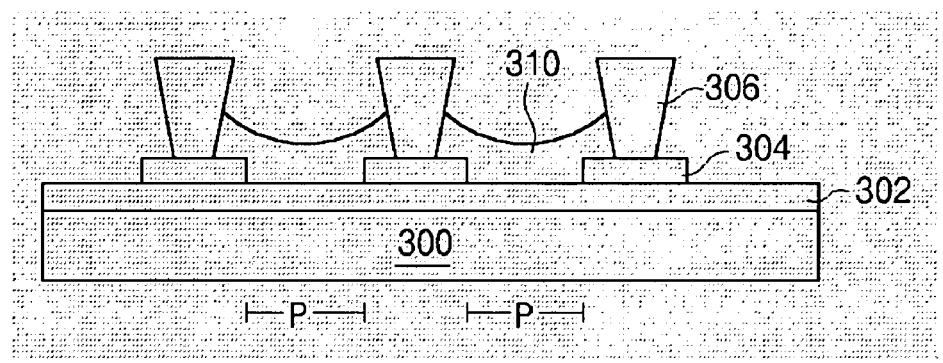

In FIG. 6B, the ink dispensed on the substrate 300 becomes an organic electroluminescent layer 310 including red, green and blue luminescence layers (not shown). Because the separators 306 are located at the boundaries of the pixel regions "P," color mixing, which may be caused by an overflow of the ink, can be prevented between neighboring pixel regions "P."

Figure 6C:
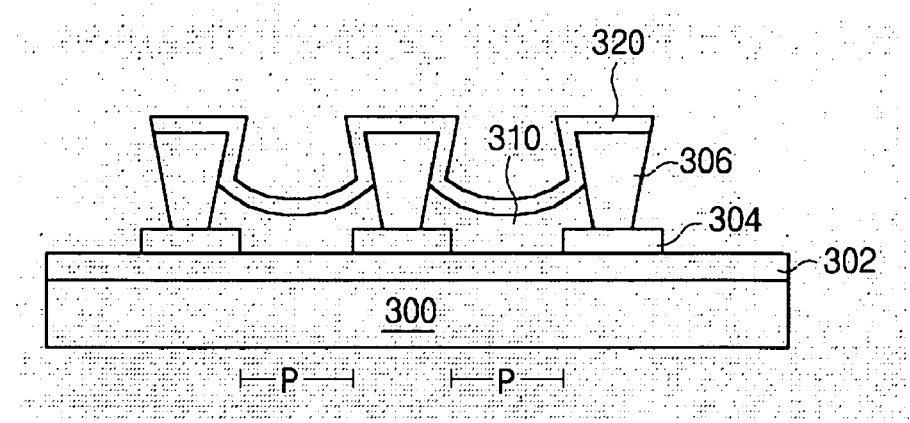

In FIG. 6C, a second electrode material layer 320 is formed on an entire surface of the organic EL layer 310 and the separators 306. The second electrode material layer 320 is formed by depositing a metallic material having a low work function and a good reflectivity such as titanium (Ti), molybdenum (Mo), calcium (Ca), barium (Ba), or the like. However, when the organic electroluminescent layer 310 is formed by an inkjet-printing method, a pinning phenomenon occurs, which is caused by the surface tension between the ink 352 (of FIG. 6A) and the separators 306. Due to the pinning phenomenon, it is difficult to divide the second electrode material layer for each pixel region "P." In other words, the second electrode material layer 320 is undesirably connected to each other throughout the pixel regions "P." Thus, in order to form a plurality of second electrodes in each pixel region, a pixellation step of the second electrode material layer 320 is required.

Figure 6D:
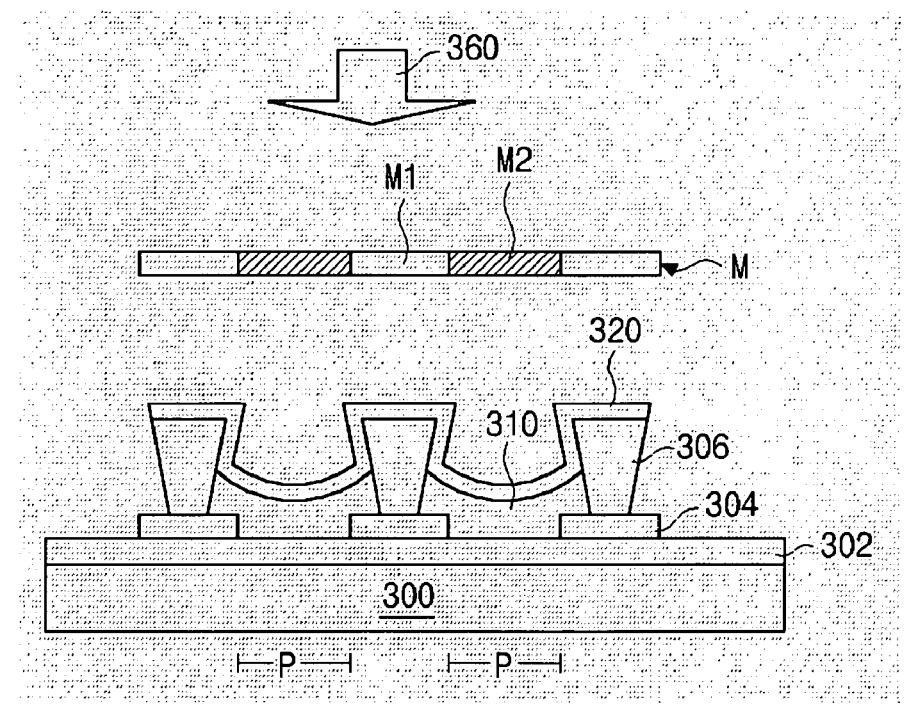

In FIG. 6D, a mask "M" including light-transmitting portions "M1" and light-shielding portions "M2" is disposed over the second electrode material layer 320 for a pixellation step. The light-transmitting portions "M1" correspond to the boundaries of the pixel regions "P," and the light-shielding portions "M2" correspond to the pixel regions "P." Then, light 360 is irradiated onto a portion of the second electrode material layer 320 through the light-transmitting portions "M1" of the mask "M" to oxidate the second electrode material layer 320 at the boundaries of the pixel regions "P." A source of the light 360 may be ultra violet (UV). As a result, a portion of the second electrode material layer 320 corresponding to the light-transmitting portions "M1" is oxidated by the incident light.

Figure 6E:
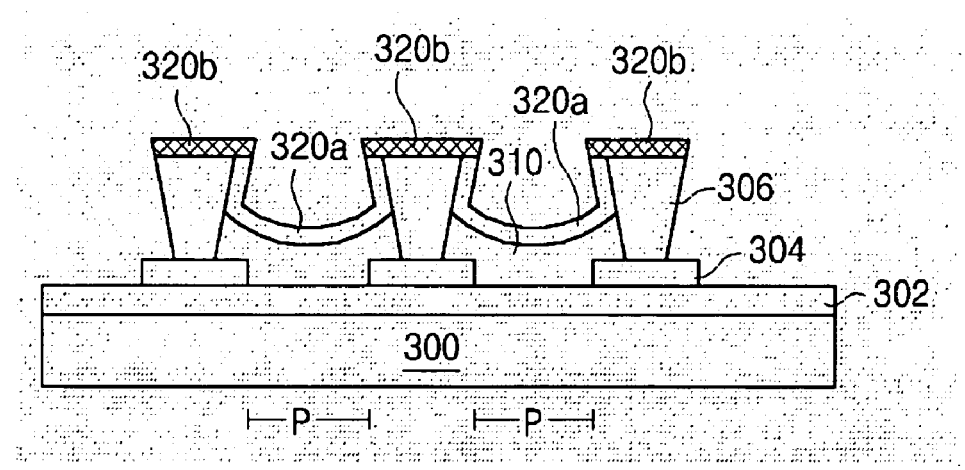

With the oxidation process, the second electrode material layer 320 (of FIG. 6D) is divided into second electrodes 320a in the pixel regions "P" and a metal oxide layer 320b at the boundaries of the pixel regions "P," as shown in FIG. 6E. The metal oxide layer 320b is formed by oxidating the second electrode material layer 320, and electrically separate the second electrodes 320a from each other. Accordingly, each of the second electrodes 320a can have a stable pixel structure with the separators 306 and metal oxide layer 320b.

FIGS. 7A to 7G are schematic cross-sectional views illustrating a fabricating process according to a second embodiment of present invention.

Figure 7A:
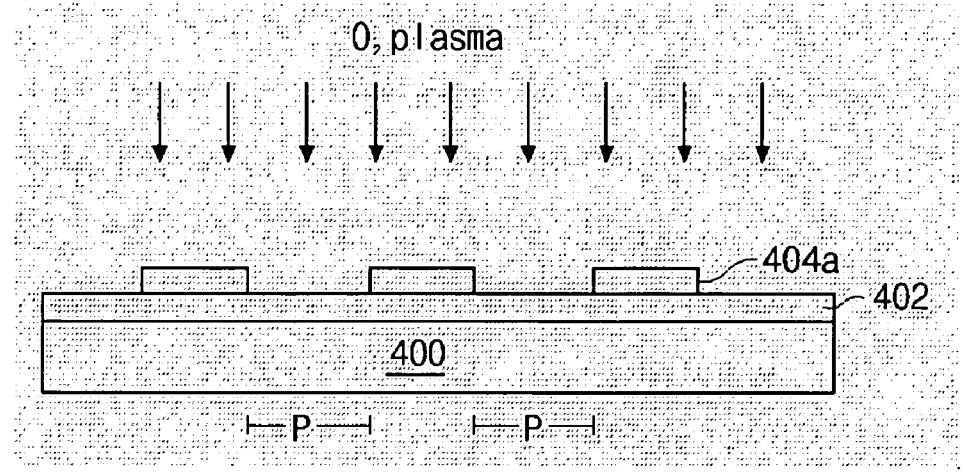
FIGS. 7A to 7G are schematic cross-sectional views illustrating a fabricating process according to a second embodiment of present invention.

In FIG. 7A, pixel regions "P" is defined in a substrate 400. A first electrode 402 is formed on the substrate 400 including the pixel regions "P." The first electrode 402 is made of a transparent conductive material such as tin oxide (ITO), indium zinc oxide (IZO) and indium tin zinc oxide (ITZO), or the like. Then, an insulating layer 404a is formed on the first electrode 402 at boundaries of the pixel regions "P" to prevent shorting between the first electrode 402 and second electrodes that will be formed later. Although not shown in FIG. 7A, the insulating layer 404a may be formed as one body in a plan view. In addition, the insulating layer 404a may be formed by depositing and patterning silicon nitride (SiNx) or silicon oxide ($SiO_2$), or by coating and patterning polyimide. For example, the patterning step may include a photolithography process using a photo-resist pattern.

Then, in order for a surface of the first electrode 402 to have a hydrophilic property, an entire surface of the insulating layer 404a is treated with $O_2$ plasma. Although not shown in FIG. 7A, this $O_2$ plasma process includes disposing the substrate 400 having the insulating layer 404a and the first electrode 402 in a vacuum chamber, and injecting a carrier gas such as argon (Ar) and a source gas such as oxygen ($O_2$) to the vacuum chamber. An exemplary process condition for the $O_2$ plasma process is as follows. The flow rate between Ar and Oxygen is about 8:2, and the power supply is about 1,000 Watt (W) with about 50 Volts (V). The process time is about 30 seconds.

Figure 7B:
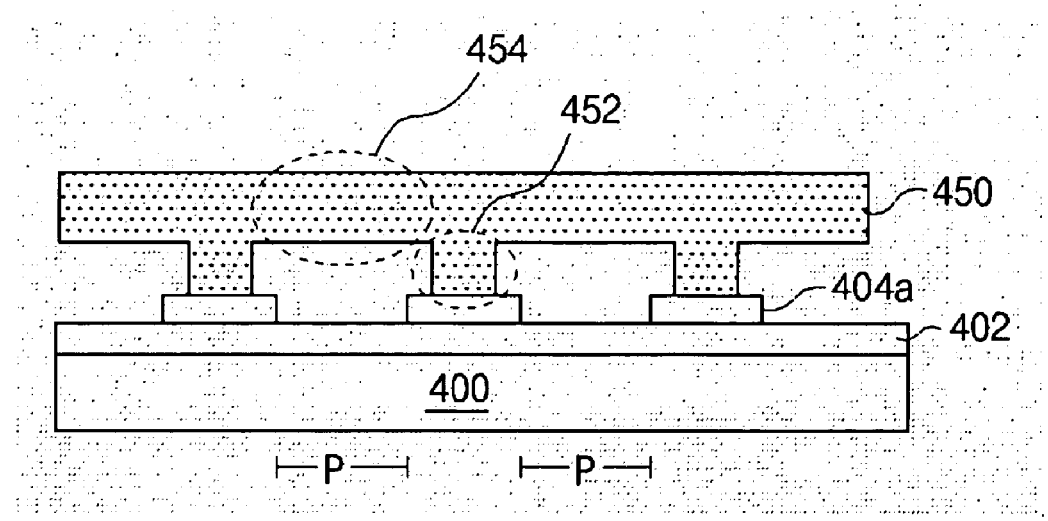

In FIG. 7B, in order for a surface of the insulating layer 404a to have a hydrophobic property, a mold 450 having a super hydrophobic property contacts a surface of the insulating layer 404a. The mold 450 has a protruding portion 452 and a receded portion 454. The protruding portion 452 and the receded portion 454 are located over a portion of the insulating layer 404a and the pixel regions "P," respectively. The mold 450 may be manufactured by a molding process and acts as a flexible mask.

A manufacturing process of the mold 450 will be explained hereinafter. A mixed liquid having polydimethylsiloxane (PDMS) and about 10% weight of a hardening agent is prepared, and a mold frame containing the mixed liquid is heated at about 90° C. The mold 450 is formed by hardening the mixed liquid in the mold frame. The mold 450 formed by this process is called a PDMS mold.

In addition, a width of the protruding portion 452 of the mold 450 is beneficially smaller than that of the insulating layer 404a. Accordingly, due to the width difference, the non-contacting portion of the insulating layer 404a has a hydrophilic property. For another example, the mold 450 may be formed of one of elastomer materials having a hydrophobic property such as polyurethane rubber instead of PDMS. In order for a portion of the insulating layer 404a to a hydrophobic property, the mold 450 contacts the portion of the insulating layer 404a under a temperature range between room temperature and about 100° C. for about 1 to 10 min.

Only the portion of the insulating layer 404a contacted by the mold 450 becomes to have a hydrophobic property, and then the mold 450 is removed.

Figure 7C:
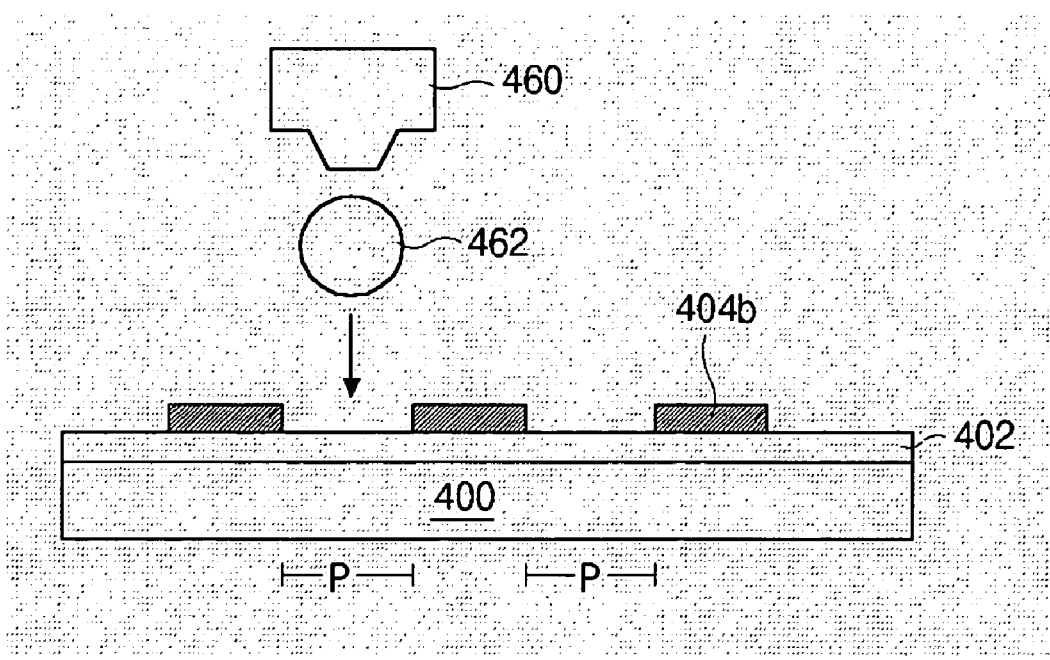

Next, as shown in FIG. 7C, a solution type ink 462 is dispensed on the substrate 400 having the hydrophobic insulating layer 404b by an inkjet-printing method. Specifically, the solution type ink 462 is dispensed on the substrate 400 in the pixel regions "P" surrounded by the hydrophobic insulating layer 404b through an ink-jet head 460. Since the insulating layer 404b has a hydrophobic property, the solution type ink 462 is located only in the pixel regions "P," not on the hydrophobic insulating layer 404b.

Figure 7D:
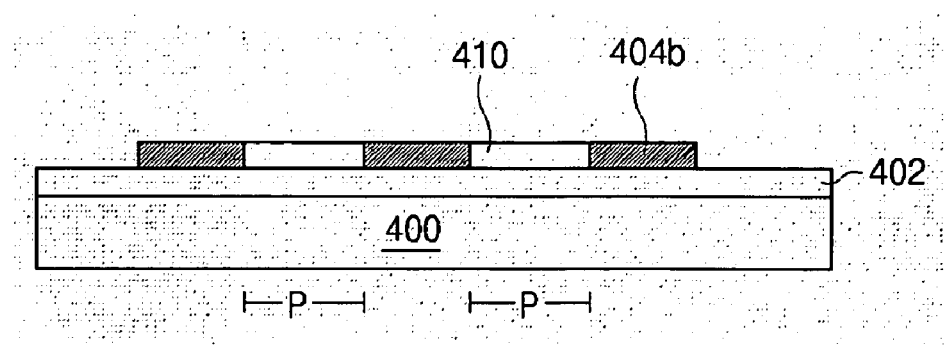

In FIG. 7D, the pixel regions "P" become to have a hydrophilic property by the $O_2$ plasma treating described above, and a surface of the hydrophobic insulating layer 404b comes to have a hydrophobic property by the mold 450 (of FIG. 7B) having a super hydrophobic property. After that, the solution type ink 462 (of FIG. 7C) is coated on the substrate 400 by the aforementioned inkjet-printing method. Because the solution type ink 462 has a hydrophilic property, it is coated in the pixel regions "P," but not on the hydrophobic insulating layer 404b. Accordingly, the solution type ink 462 (of FIG. 7C) that includes a luminescent material is not coated in the portion of the hydrophobic insulating layer 404b at the boundaries of the pixel regions "P." Thus, the solution type ink 462 (of FIG. 7C) can be patterned into red, green and blue organic electroluminescent layers corresponding to the pixel regions "P," without a photolithography process. That is, each of the red, green and blue organic electroluminescent layers is located in each pixel region "P." Therefore, color mixing can be prevented between neighboring pixel regions "P." Specifically, the solution type ink 462 (of FIG. 7C) is coated in the pixel regions "P" by moving the inkjet head 460 (of FIG. 7C) or a nozzle (not shown) during the inkjet-printing. Thus, color mixing is prevented without an additional separator using surface property, thereby effectively forming the organic electroluminescent layer 410 only in the pixel regions "P."

Figure 7E:
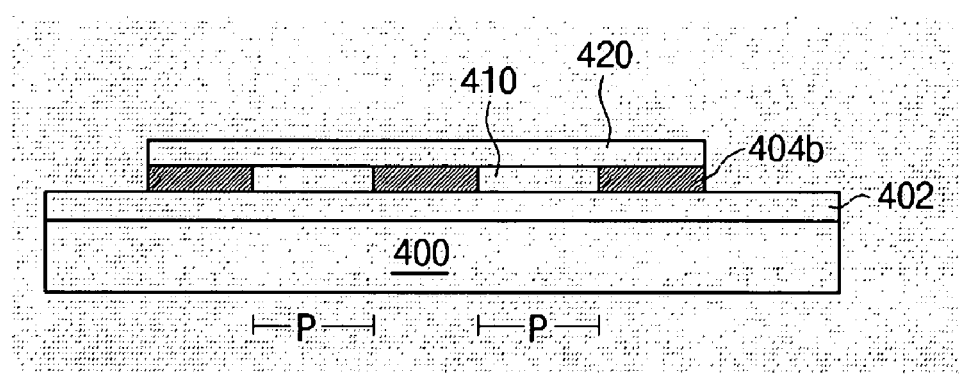

In FIG. 7E, a second electrode material layer 420 is formed on an entire surface of the hydrophobic insulating layer 404b and the organic EL layers 410. The second electrode material layer 420 may be a metallic material having a low work function and a good reflectivity such as titanium (Ti), molybdenum (Mo), calcium (Ca), barium (Ba), or the like.

Figure 7F:
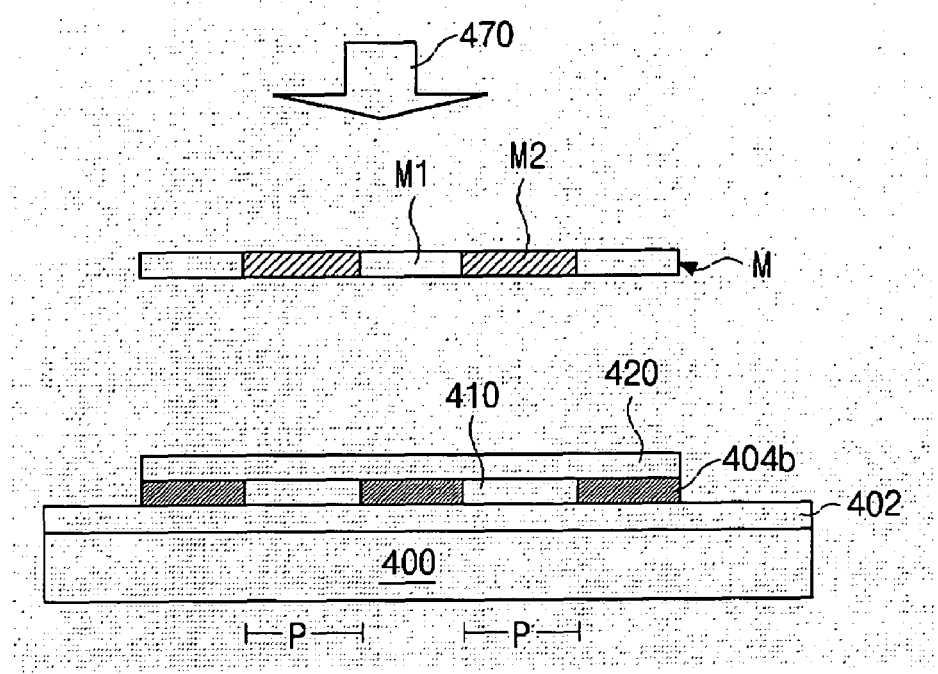

Referring to FIG. 7F, then, a mask "M" having a light-transmitting portion "M1" and a light-shielding portion "M2" is disposed over the substrate 400 having the second electrode material layer 420. As the light-transmitting portion "M1" is a region, which completely transmits light, it corresponds to a portion of the second electrode material layer 420 that is in contact with the hydrophobic insulating layer 404b. On the other hand, as the light-shielding portion "M2" is a region, which completely shields light, it corresponds to the other portion of the second electrode material layer 420 that is on the pixel regions "P." As light 470 is irradiated onto the substrate 400 having the second electrode material layer 420 through the mask "M," the portion of the hydrophobic insulating layer 404b corresponding to the light-transmitting portions "M1" is exposed. The light 470 has a desirable wavelength such as ultra violet (UV).

Figure 7G:
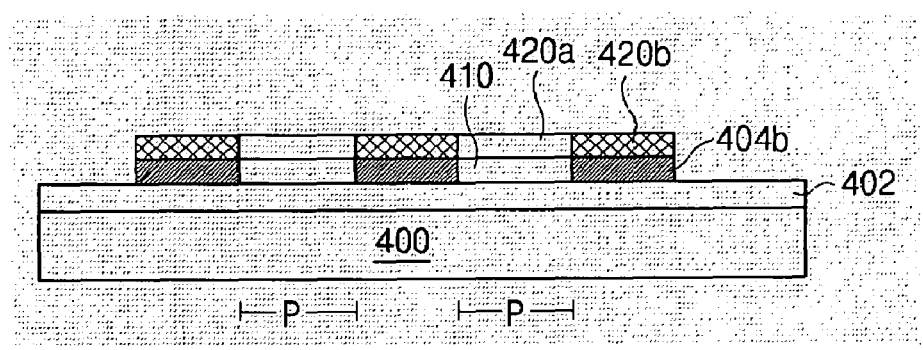

In FIG. 7G, the second electrode material layer 420 is divided into second electrodes 420a in the pixel regions "P" and a metal oxide layer 420b at the boundaries of the pixel regions "P." The metal oxide layer may be formed as one body as observed in a plan view. The metal oxide layer 420b is formed by oxidating the second electrode material layer 420, and the second electrodes 420a are electrically separated each other by the metal oxide layer 420b.

A dual plate ELD according to the second embodiment of the present invention has a pixel structure wherein the organic electroluminescent layers 410 are formed in each pixel region "P" by the hydrophobic insulating layer 404b without an additional mask process. As the metal oxide layer 420b corresponding to the hydrophobic insulating layer 404b is oxidized by the light 470 (of FIG. 7F), the metal oxide layer 420b prevents shorting between the second electrodes 420 located in the neighboring pixel regions "P." Accordingly, the dual plate ELD has improved reliability and stability, and a fabrication process for the ELD can be simplified, thereby reducing production cost.

FIGS. 8A to 8E are schematic cross-sectional views illustrating a fabrication process according to a third embodiment of present invention.

Figure 8A:
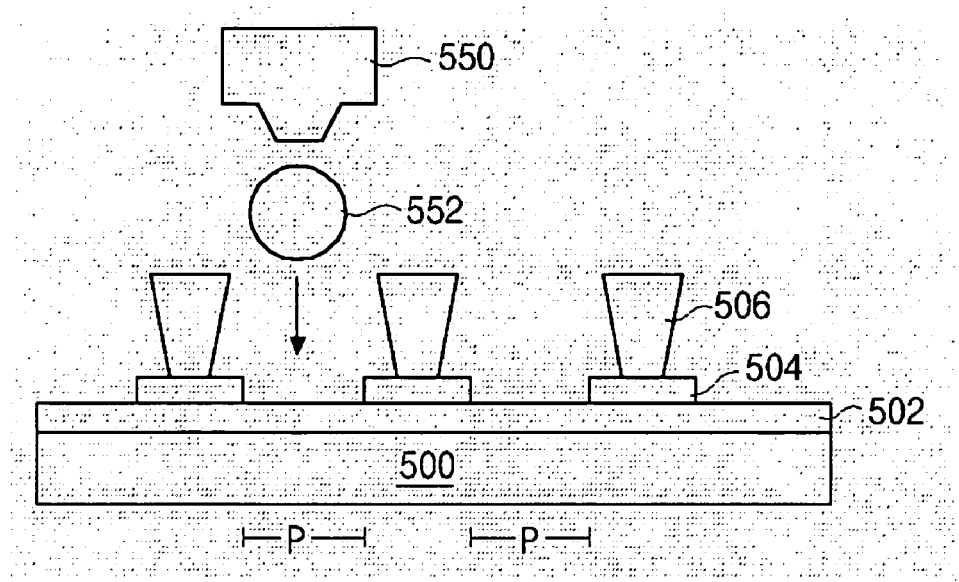
FIGS. 8A to 8E are schematic cross-sectional views illustrating a fabricating process according to a third embodiment of present invention.

In FIG. 8A, pixel regions "P" is defined in a substrate 500. A first electrode 502 is formed on the substrate 500 including the pixel regions "P." The first electrode 502 is made of a transparent conductive material such as indium tin oxide (ITO), indium zinc oxide (IZO), indium tin zinc oxide (ITZO), or the like. Then, an insulating layer 504 is formed on the first electrode 502 at boundaries of the pixel regions "P" to prevent shorting between the first electrode 502 and a second electrode that will be formed later. Although not shown in FIG. 8A, the insulating layer 504 may be formed as one body as observed in a plan view. In addition, the insulating layer 504 may be formed by depositing and patterning silicon nitride (SiNx) or silicon oxide (SiO2), or the insulating layer may be formed by coating and patterning polyimide. For example, a the patterning step may be a photolithography process using a photo-resist pattern.

Then, an organic photosensitive material is coated on an entire surface of the insulating layer 504 and is patterned into separators 506 which have an inverted taper shape. The inverted shape of the separators 506 may be formed by controlling an amount of an exposing light or selecting types of organic photosensitive materials. Then, an ink 552 is dispensed on the substrate 500 including the separators 506 through an inkjet head 550 by an inkjet printing method, as shown in FIG. 8A.

Figure 8B:
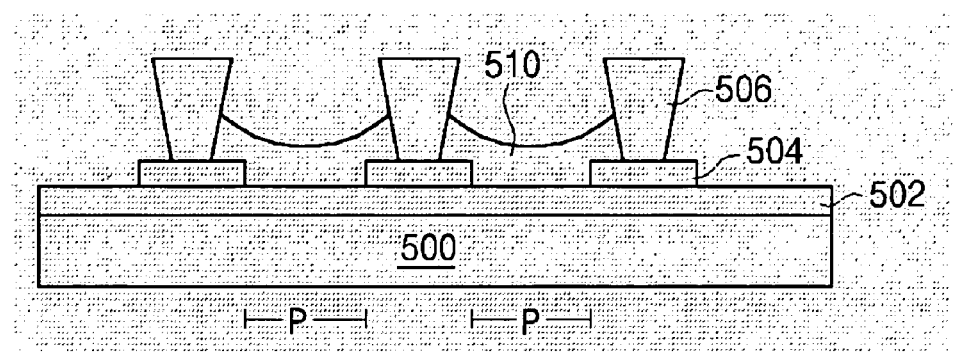

In FIG. 8B, the ink 552 dispensed on the substrate 500 becomes an organic electroluminescent layer 510 including red, green and blue luminescence layers (not shown). Because the separators 506 are located at the boundaries of the pixel regions "P," color mixing, which may be caused by an overflow of the ink 552 (of FIG. 8A), can be prevented between neighboring pixel regions "P." Although not shown in FIG. 8B, the organic EL layers 510 includes the red, green and blue organic EL layers in each of the pixel regions "P."

Figure 8C:
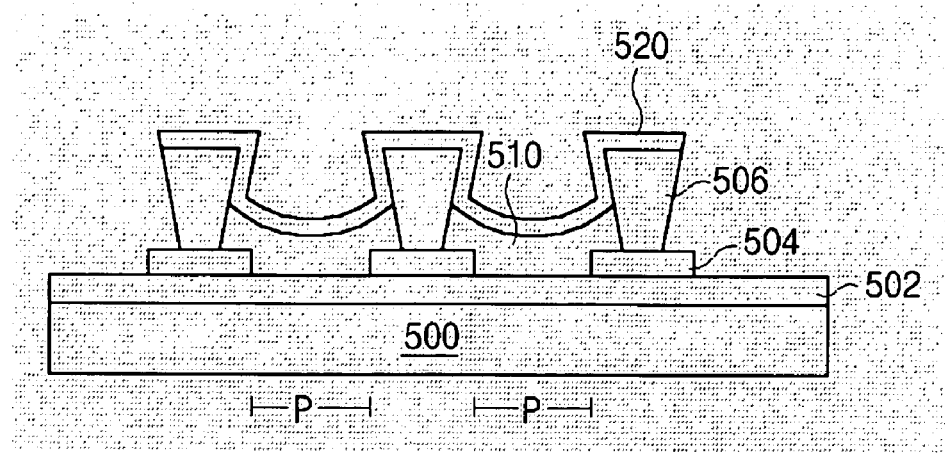

In FIG. 8C, a second electrode material layer 520 is formed on an entire surface of the organic EL layer 510 and the separators 506. The second electrode material layer 520 is formed by depositing a metallic material having a low work function and a good reflectivity such as titanium (Ti), molybdenum (Mo), calcium (Ca), barium (Ba), or the like. However, when the organic electroluminescent layer 510 is formed by an inkjet-printing method, a pinning phenomenon occurs, which is caused by the surface tension between the ink 552 (of FIG. 8A) and the separators 506. Due to the pinning phenomenon, it is difficult to divide the second electrode material layer 520 for each pixel region "P." In other words, the second electrode material layer 520 is undesirably connected to each other throughout the pixel regions "P." Thus, in order to form a plurality of second electrodes in each pixel region, a pixellation step of the second electrode material layer 520 is required.

Figure 8D:
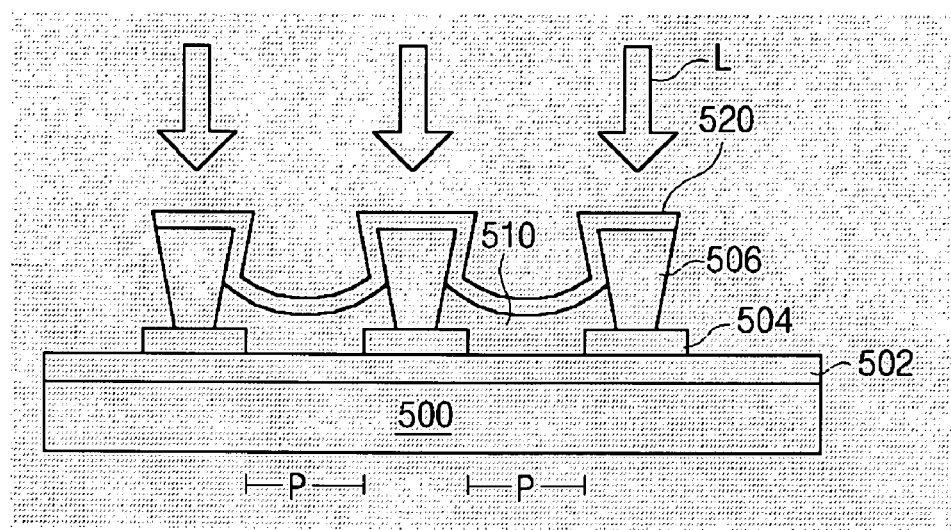

FIG. 8D illustrates a laser ablation process through which the second electrode material layer 520 is divided into a plurality of second electrodes in each pixel region "P." A laser "L" for the laser ablation process has a wavelength such that the second electrode material layer 520 absorbs the laser "L." The laser "L" is only irradiated to a portion of the second electrode material layer 520 corresponding to the separators 506. Therefore, the irradiated portion of the second electrode material layer 520 melts and burns out.

Figure 8E:
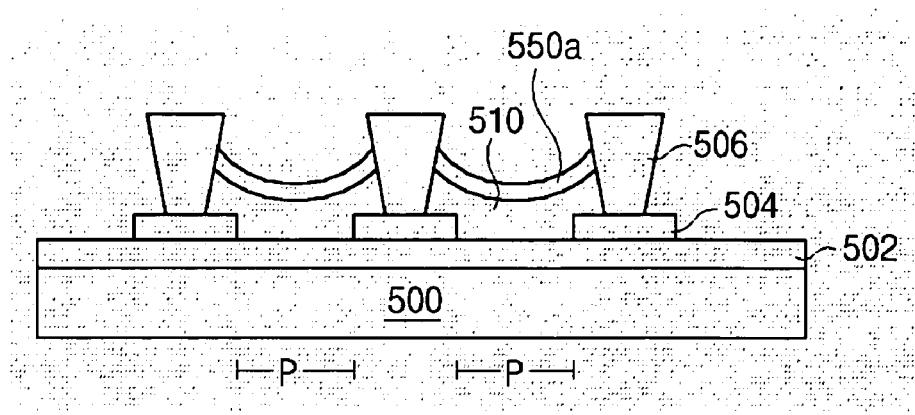

As shown in FIG. 8E, the second electrode material layer 520 (of FIG. 8D) is divided into a plurality of second electrodes 550a through the laser ablation process. Specifically, the portion of the second electrode material layer 520 (of FIG. 8D) corresponding to the separators 506 ablates and is removed by the laser "L," so that the second electrodes 550a can be formed in each pixel region "P." In comparison with the first embodiment, the second electrode material layer 520 (of FIG. 8D) does not exist on the separator 506 after the process. In other words, the second electrodes 550a have an island shape (are isolated from each other).

In the laser ablation process, as the portion of the second electrode material layer 520 (of FIG. 8D) corresponding to separators 506 is removed by the laser "L," the second electrode material layer 520 (of FIG. 8D) is patterned into the second electrodes 550a without an additional patterning step, thereby obtaining a dual plate type ELD with improved reliability. Furthermore, the step of forming the second electrodes 550a does not require a photo-mask, thereby reducing the number of manufacturing process and manufacturing cost. Accordingly, the second electrodes 520a can be patterned through the ablating process without an additional mask process, thereby reducing production cost.

FIGS. 9A to 9G are schematic cross-sectional views illustrating a fabricating process according to a fourth embodiment of present invention.

Figure 9A:
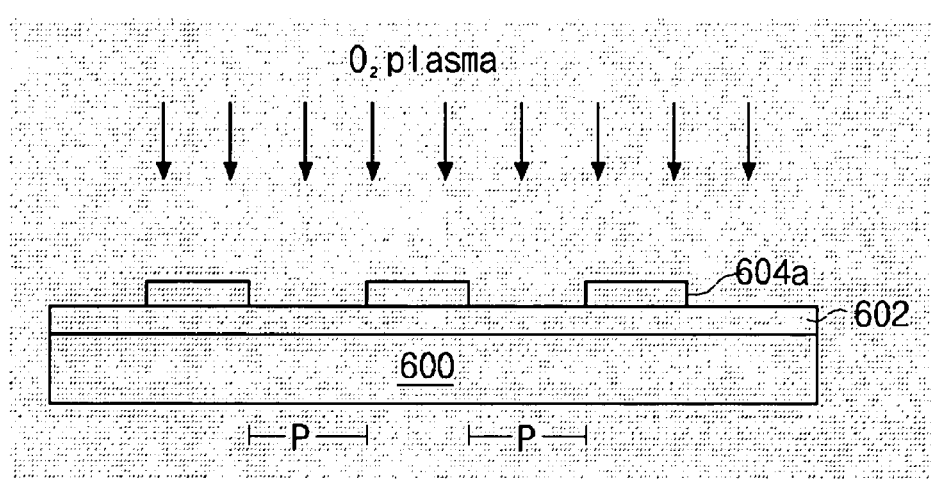
FIGS. 9A to 9G are schematic cross-sectional views illustrating a fabricating process according to a fourth embodiment of present invention.

In FIG. 9A, pixel regions "P" is defined in a substrate 600. A first electrode 602 is formed on the substrate 600 including the pixel regions "P." The first electrode 602 is made of a transparent conductive material such as indium tin oxide (ITO), indium zinc oxide (IZO), indium tin zinc oxide (ITZO), or the like. Then, an insulating layer 604a is formed on the first electrode 602 at boundaries of the pixel regions "P" to prevent shorting between the first electrode 602 and second electrode that will be formed later. Although not shown in FIG. 9A, the insulating layer 604a may be formed as one body as observed in a plan view. In addition, the insulating layer 604a may be formed by depositing and patterning silicon nitride (SiNx) or silicon oxide (SiO$_2$), or by coating and patterning polyimide. For example, the patterning step may includes a photolithography process using a photo-resist pattern.

Then, in order for a surface of the first electrode 602 to have a hydrophilic property, an entire surface of the insulating layer 604a is treated with O$_2$ plasma. Although not shown in FIG. 9A, this O$_2$ plasma includes disposing the substrate 600 having the insulating layer 604a and the first electrode 602 in a vacuum chamber, and injecting a carrier gas such as argon (Ar) and a source gas such as oxygen (O$_2$) to the vacuum chamber. An exemplary process condition for the O$_2$ plasma process is as follows. The flow rate between Ar and Oxygen is about 8:2, and the power supply is about 1,000 Watt (W) with about 50 Volts (V). The process time is about 30 seconds.

Figure 9B:
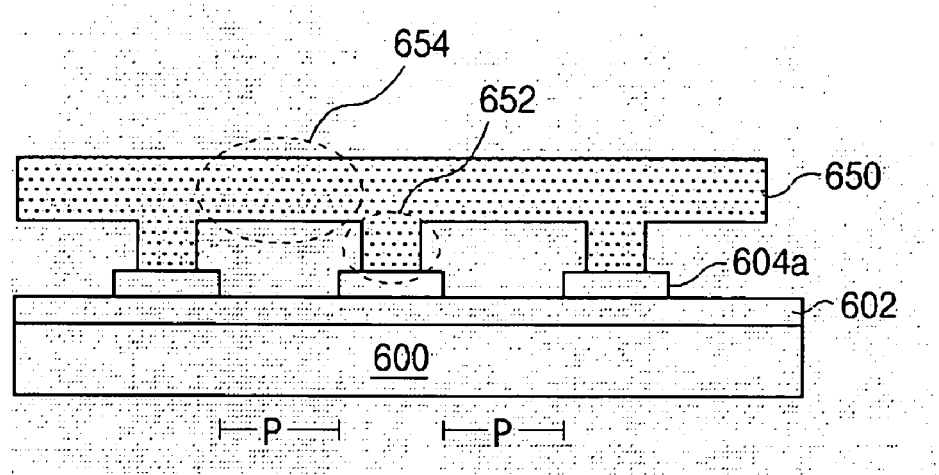

In FIG. 9B, in order for a surface of the insulating layer 604a to have a hydrophobic property, a mold 650 having a super hydrophobic property contacts a surface of the insulating layer 604a. The mold 650 has a protruding portion 652 and a receded portion 654. The protruding portion 652 and the receded portion 654 are located over a portion of the insulating layer 604a and the pixel regions "P," respectively. The mold 650 may be manufactured by a molding process and acts as a flexible mask.

A manufacturing process of the mold 650 will be explained hereinafter. A mixed liquid having polydimethylsiloxane (PDMS) and about 10% weight of a hardening agent is prepared, and a mold frame containing the mixed liquid is heated at about 90° C. The mold 650 is formed by hardening the mixed liquid in the mold frame. The mold 650 formed by this process is called a PDMS mold.

In addition, a width of the protruding portion 652 of the mold 650 is beneficially smaller than that of the insulating layer 604a. Accordingly, due to the width difference, the non-contacting portion of the insulating layer 604a has a hydrophilic property. For another example, the mold 650 may be formed of one of elastomer materials having a hydrophobic property such as polyurethane rubber instead of PDMS. In order for a portion of the insulating layer 404a to a hydrophobic property, the mold 450 contacts the portion of the insulating layer 404a under a temperature range between room temperature and 100° C. for about 1 to 10 min. Only the portion of the insulating layer 604a contacted by the mold 650 becomes to have a hydrophobic property, and then the mold 650 is removed.

Figure 9C:
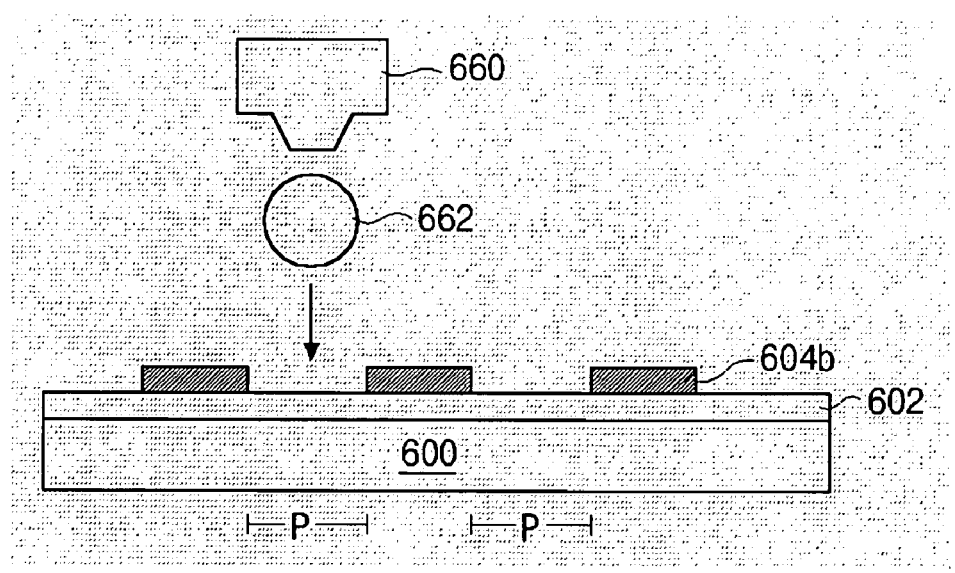

Next, as shown in FIG. 9C, a solution type ink 662 is dispensed on the substrate 600 having the hydrophobic insulating layer 604b by an inkjet-printing method. Specifically, the solution type ink 662 is dispensed on the substrate 600 in the pixel regions "P" surrounded by the hydrophobic insulating layer 604b through an inkjet head 660. Since the insulating layer 604b has a hydrophobic property, the solution type ink 662 is located only in the pixel regions "P," not on the hydrophobic insulating layer 604b.

Figure 9D:
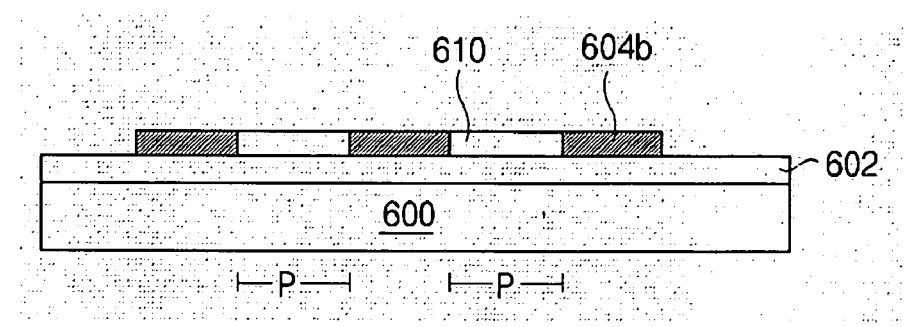

In FIG. 9D, the pixel regions "P" come to have a hydrophilic property by the $O_2$ plasma treating described above, and a surface of the hydrophobic insulating layer 604b comes to have a hydrophobic property by the mold 650 (of FIG. 9B) having a super hydrophobic property. After that, a solution type ink 662 including a luminescent material is coated on the substrate 600 by an inkjet-printing method. Because the solution type ink 662 has a hydrophilic property, it is coated in the pixel regions "P," but not on the hydrophobic insulating layer 604b. Accordingly, the solution type ink 662 is not coated in the portion of the hydrophobic insulating layer 604b at the boundaries of the pixel regions "P." Thus, the solution type ink 662 can be patterned into red, green and blue organic electroluminescent layers corresponding to the pixel regions "P," without a photolithography process. That is, each of the red, green and blue organic electroluminescent layers is located in each pixel region "P." Therefore, color mixing can be prevented between neighboring pixel regions "P." Specifically, the solution type ink 662 is coated in the pixel regions "P" by moving the inkjet head 660 or a nozzle (not shown) during the inkjet-printing. Thus, color mixing is prevented without an additional using surface property, thereby effectively forming the organic electroluminescent layer 610 only in the pixel regions "P."

Figure 9E:
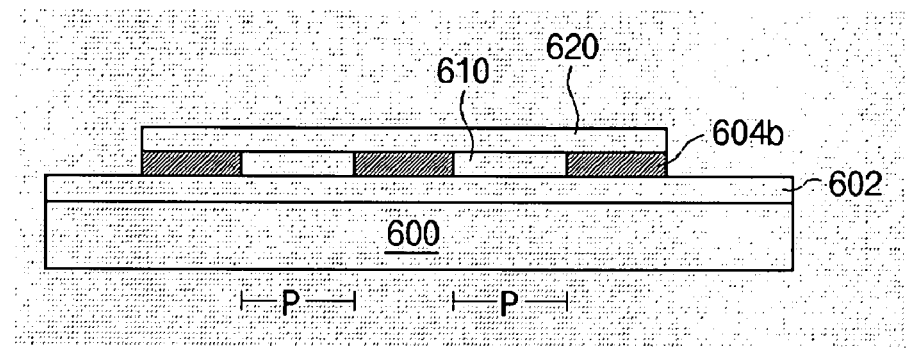

In FIG. 9E, a second electrode material layer 620 is formed on an entire surface of the hydrophobic insulating layer 604b and the organic EL layers 610. The second electrode material layer 620 may be a metallic material having a low work function and a good reflectivity such as titanium (Ti), molybdenum (Mo), calcium (Ca), barium (Ba) or the like.

Figure 9F:
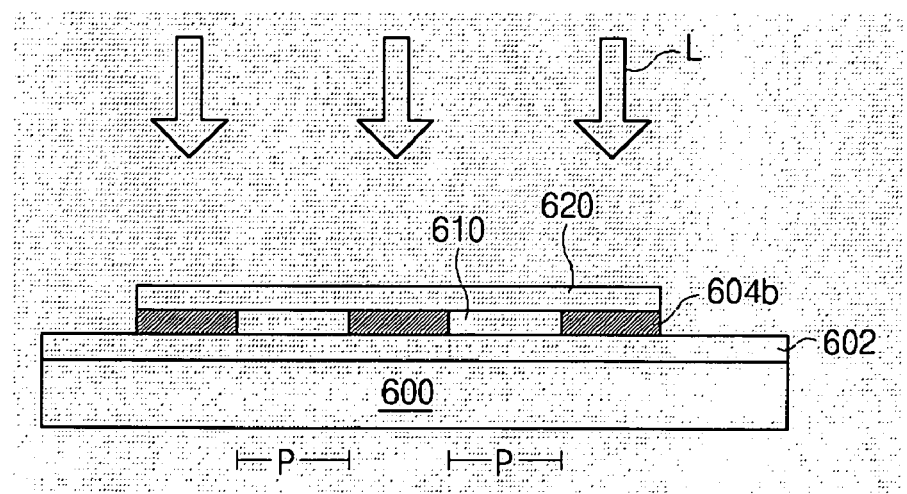

In FIG. 9F, the second electrode material layer 620 at the boundaries of the pixel regions "P" is ablated by a laser "L." The laser "L" has a wavelength such that the second electrode material layer 620 absorbs the laser "L." Thus, the ablated second electrode material layer 620 melts simultaneously under a high temperature, and the ablated second electrode material layer 620 portion is removed.

Figure 9G:
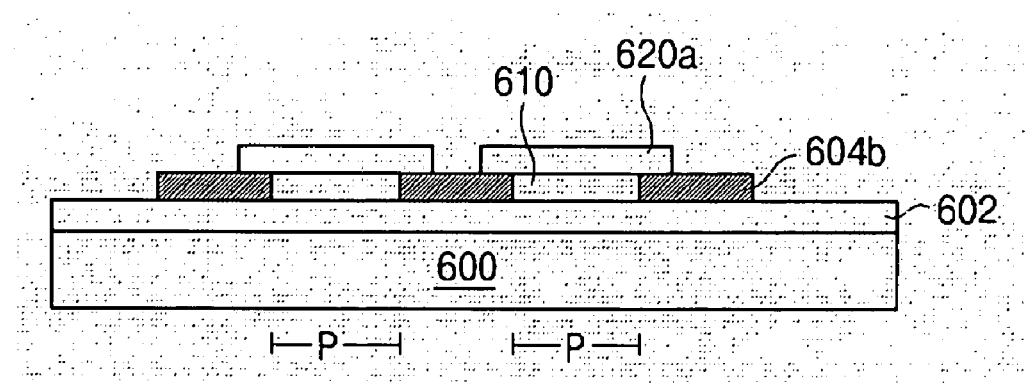

In FIG. 9G, second electrodes 620a are formed by the ablating process of the second electrode material layer 620 (of FIG. 9F) in the pixel regions "P." Accordingly, the second electrodes 620a can be patterned through the ablating process without an additional mask process, thereby reducing production cost.

An organic ELD and a method of fabrication thereof according to the present invention results in several advantages. First, the organic EL layers for organic ELD can be formed by separators having an inverted trapezoid shape or a hydrophobic insulating layer without the color mixing problem. Second, the second electrodes of the organic ELD can be electrically patterned by oxidizing a metal oxide at boundaries of the pixel region, or can be physically patterned by an ablating process using a laser, thereby simplifying manufacturing process and increasing productivity with low production cost. Furthermore, a dual plate type organic ELD according to the present invention is more reliable and stable.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a substrate for an organic electroluminescent device, comprising:
    forming a first electrode on a substrate having a pixel region;
    forming an insulating layer on the first electrode;
    patterning the insulating layer, the patterned insulating layer being formed at a boundary of the pixel region;
    forming an electroluminescent layer on the first electrode in the pixel region by printing a solution type electroluminescent material;
    forming a second electrode material layer on an entire surface of the substrate having the electroluminescent layer and the patterned insulating layer; and
    oxidizing the second electrode material layer at the boundary of the pixel region to form a second electrode in the pixel region and a metal oxide layer at the boundary of the pixel region,
    wherein the oxidizing comprises:
        preparing a mask including a light-transmitting portion corresponding to the boundary of the pixel region and a light-shielding portion corresponding to the pixel region;
        irradiating light to the second electrode material layer in the boundary of the pixel region through the light-transmitting portion of the mask; and
        oxidizing the second electrode material layer corresponding to the light-transmitting portion of the mask.

2. The method according to claim 1, further comprising forming a hydrophobic surface of the insulating layer by a hydrophobic treatment, wherein the electroluminescent material has a hydrophilic property.

3. The method according to claim 2, wherein the second electrode has a height corresponding to a height of the insulating layer.

4. The method according to claim 2, wherein the insulating layer includes one of polyimide, silicon nitride (SiNx) and silicon oxide (SiO2).

5. The method according to claim 4, wherein the insulating layer is formed by a photolithography process using a photo-resist pattern.

6. The method according to claim 1, wherein the first electrode is formed of one of indium tin oxide (ITO), indium zinc oxide (IZO) and indium tin zinc oxide (ITZO).

7. The method according to claim 1, wherein the electroluminescent layer is formed by an inkjet-printing method.

8. The method according to claim 1, further comprising: forming a separator on the insulating layer, wherein the separator has an inverted trapezoid shape such that a width of the separator gradually increases from a first side to a second side of the separator, the first side is closer to the substrate than the second side.

9. The method according to claim 8, wherein the separator is formed by depositing and patterning an organic photo-sensitive material.

10. The method according to claim 1, wherein the second electrode material layer includes one of titanium (Ti), molybdenum (Mo), calcium (Ca) and barium (Ba).

11. The method according to claim 1, wherein the light includes ultra violet light.

12. The method according to claim 2, wherein the insulating layer has the hydrophobic property by being in contact with polydimethylsiloxane (PDMS).

13. The method according to claim 12, wherein the insulating layer is in contact with the PDMS for about 1 minute to 10 minutes.

14. The method according to claim 2, further comprising treating an entire surface of the insulating layer with oxygen (O.sub.2) plasma in a vacuum chamber before the hydrophobic treatment.

15. A method of fabricating an organic electroluminescent device, comprising:
  forming an array element on a first substrate having a pixel region, the array element having a thin film transistor;
  forming a first electrode on a second substrate in the pixel region;
  forming an insulating layer on the first electrode;
  patterning the insulating layer, the patterned insulating layer being formed at a boundary of the pixel region;
  forming an electroluminescent layer on the first electrode in the pixel region by printing a solution type electroluminescent material;
  forming a second electrode material layer on an entire surface of the second substrate having the electroluminescent layer and the patterned insulating layer;
  oxidizing the second electrode material layer at the boundary of the pixel region to form a second electrode in the pixel region and a metal oxide layer at the boundary of the pixel region;
  forming a connection electrode on one of the first and second substrate; and
  attaching the first substrate to the second substrate with a sealant, the first substrate electrically connected to the second substrate by the connection electrode,
  wherein the oxidizing comprises:
    preparing a mask including a light-transmitting portion corresponding to the boundary of the pixel region and a light-shielding portion corresponding to the pixel region;
    irradiating light to the second electrode material layer in the boundary of the pixel region through the light-transmitting portion of the mask; and
    oxidizing the second electrode material layer corresponding to the light-transmitting portion of the mask.

16. The method according to claim 15, further comprising forming a hydrophobic surface of the insulating layer by a hydrophobic treatment, and the electroluminescent material has a hydrophilic property.

17. The method according to claim 15, further comprising:
  forming a separator on the insulating layer, wherein the separator has an inverted trapezoid shape such that a width of the separator gradually increases from a first side to a second side of the separator, the first side is closer to the substrate than the second side.

18. The method according to claim 15, wherein the light includes ultra violet light.

* * * * *